United States Patent
Shen et al.

(10) Patent No.: US 10,333,552 B2
(45) Date of Patent: Jun. 25, 2019

(54) METHODS AND APPARATUSES FOR CONSTRUCTING PUNCTURED POLAR CODE

(71) Applicant: HUAWEI TECHNOLOGIES CO., LTD., Shenzhen (CN)

(72) Inventors: Hui Shen, Shenzhen (CN); Bin Li, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 147 days.

(21) Appl. No.: 15/363,028

(22) Filed: Nov. 29, 2016

(65) Prior Publication Data
US 2017/0077954 A1    Mar. 16, 2017

Related U.S. Application Data

(63) Continuation of application No. PCT/CN2014/079020, filed on May 30, 2014.

(51) Int. Cl.
  H03M 13/00  (2006.01)
  H03M 13/13  (2006.01)
  H04L 1/00   (2006.01)

(52) U.S. Cl.
  CPC ......... *H03M 13/13* (2013.01); *H03M 13/005* (2013.01); *H03M 13/6362* (2013.01); *H04L 1/0058* (2013.01)

(58) Field of Classification Search
  CPC ............... H03M 13/005; H03M 13/13; H03M 13/6362; H04L 1/0058
  See application file for complete search history.

(56) References Cited

U.S. PATENT DOCUMENTS 6,963,601 B1    11/2005   Kim et al.
8,347,186 B1 *   1/2013   Arikan .................. H03M 13/13
                                              714/774
(Continued)

FOREIGN PATENT DOCUMENTS

CN    102122966 A    7/2011
CN    102694625 A    9/2012
(Continued)

OTHER PUBLICATIONS

Chen, Kai et al: "Practical polar code construction over parallel channels", IET Communications, vol. 7, No. 7, May 2013, pp. 620-627, XP006045257.
(Continued)

*Primary Examiner* — Phung M Chung
(74) *Attorney, Agent, or Firm* — Leydig, Voit & Mayer, Ltd.

(57) ABSTRACT

Methods and apparatuses are provided for constructing a punctured polar code in the encoding and decoding field to improve decoding performance of a punctured polar code and reduce a frame error rate of the punctured polar code. The method is as follows: comparing a phase sequence number of a current bit channel with a period index of a puncturing pattern to obtain a comparison result; obtaining a transition probability of the bit channel according to the comparison result and bit parity conditions of a sequence number of the bit channel in each phase; obtaining a reliability value of each bit channel according to the transition probability; and determining an information bit index set according to the reliability values.

2 Claims, 5 Drawing Sheets

(56) References Cited

U.S. PATENT DOCUMENTS

| | | | |
|---|---|---|---|
| 9,203,525 B2* | 12/2015 | Shen | ............... H04B 1/04 |
| 2008/0059105 A1 | 3/2008 | Resnick et al. | |
| 2013/0111291 A1* | 5/2013 | Ma | ............... H04L 1/0009 714/752 |
| 2013/0117344 A1 | 5/2013 | Gross et al. | |
| 2014/0019820 A1 | 1/2014 | Vardy et al. | |
| 2014/0108748 A1 | 4/2014 | Lee et al. | |
| 2015/0026543 A1 | 1/2015 | Li et al. | |

FOREIGN PATENT DOCUMENTS

| | | |
|---|---|---|
| CN | 103368583 A | 10/2013 |
| CN | 103516476 A | 1/2014 |
| CN | 103684477 A | 3/2014 |
| EP | 1482644 A2 | 12/2004 |
| EP | 2722993 A1 | 4/2014 |
| RU | 2216858 C2 | 11/2003 |

OTHER PUBLICATIONS

Niu, Kai et al: "Beyond Turbo Codes: Rate-Compatible Punctured Polar Codes", 2013 IEEE International Conference on Communications (ICC), IEEE, Communications Theory, Jun. 2013, pp. 3423-3427, XP032522402.

Extended European Search Report issued in corresponding EP Application No. 14893282, dated Jun. 19, 2017, 13 pages.

Viveck R. Cadambe et al., "Interference Alignment and Spatial Degrees of Freedom for the K User Interference Channel," Electrical Engineering and Computer Science University of California Irvine, IEEE Communications Society, ICC 2008 proceedings, Irvine, California, pp. 971-975.

International Search Report (including English translation) issued in corresponding International Application No. PCT/CN2014/079020, dated Feb. 27, 2015, 6 pages.

* cited by examiner

METHODS AND APPARATUSES FOR CONSTRUCTING PUNCTURED POLAR CODE

CROSS-REFERENCE TO RELATED APPLICATION

This application is a continuation of International Application No. PCT/CN2014/079020, filed on May 30, 2014, the disclosure of which is hereby incorporated by reference in its entirety.

TECHNICAL FIELD

Embodiments of the present disclosure relate to the encoding and decoding field, and in particular, to methods and apparatuses for constructing a punctured polar code.

BACKGROUND

In a communications system, channel encoding is generally used to improve data transmission reliability, so as to ensure communication quality. The polar code is the first code that is theoretically proved that it can achieve the Shannon capacity and has low encoding-decoding complexity. The polar code is a linear block code, and decoding of the polar code can be performed by using successive-cancellation (SC) or a successive-cancellation list (SC-List).

In the prior art, a conventional random puncturing hybrid automatic repeat request (HARQ) technology is used for the polar code, that is, a puncture location is selected randomly. However, by using this conventional technology, a frame error rate is relatively high and HARQ performance is relatively poor.

In addition, when a code length is excessively long, SC decoding can achieve good performance that is close to the Shannon limit. However, when the code length is relatively short or is an intermediate length, SC decoding of the polar code has relatively poor performance, and a punctured polar code has a high frame error rate. Compared with the performance of SC decoding, performance of List decoding is improved, but complexity of List decoding is higher than complexity of SC decoding.

SUMMARY

Embodiments of the present disclosure provide a method and an apparatus for constructing a punctured polar code, which can improve performance of a punctured polar code, and reduce a frame error rate of the punctured polar code.

According to a first aspect, an apparatus for constructing a punctured polar code is provided. The apparatus includes a processor and a memory storage accessible to the processor. The processor is configured to compare a phase sequence number of a current bit channel with a period index of a puncturing pattern to obtain a comparison result. The processor is further configured to obtain a transition probability of the bit channel according to the comparison result and bit parity conditions of a sequence number of the bit channel in each phase. The processor is further configured to obtain a reliability value of each bit channel according to the transition probability. The processor is configured to determine an information bit index set according to the reliability values.

According to a second aspect, a method for constructing a punctured polar code is provided. The method may include: comparing a phase sequence number of a current bit channel with a period index of a puncturing pattern to obtain a comparison result; obtaining a transition probability of the bit channel according to the comparison result and bit parity conditions of a sequence number of the bit channel in each phase; obtaining a reliability value of each bit channel according to the transition probability; and determining an information bit index set according to the reliability values.

BRIEF DESCRIPTION OF DRAWINGS

According to the methods and the apparatuses for constructing a punctured polar code provided in the embodiments of the present disclosure, a phase sequence number of a current bit channel is compared with a period index of a puncturing pattern to obtain a comparison result, where the puncturing pattern is an input parameter for constructing a punctured polar code; a transition probability of the bit channel is obtained according to the comparison result and bit parity conditions of a sequence number of the bit channel in each phase; a reliability value of each bit channel is obtained according to the transition probability; and an information bit index set is determined according to the reliability values. In this way, the input parameter of the punctured polar code is determined according to the reliability value of the channel, which can improve performance of the punctured polar code, and reduce a frame error rate of the punctured polar code.

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skilled in the art may still derive other drawings from these accompanying drawings without creative efforts.

DESCRIPTION OF EMBODIMENTS

Figure 1:
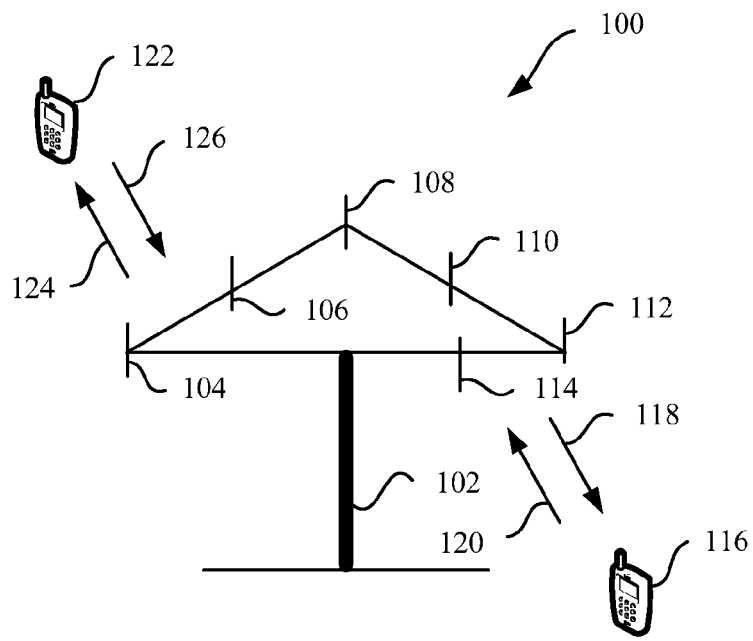
FIG. 1 is a schematic diagram of a wireless communications system according to embodiments of the present disclosure.

The following clearly describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skilled in the art based on the embodiments of the present disclosure without creative efforts shall fall within the protection scope of the present disclosure.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer-readable media that store various data structures. The components may communicate by using a local and/or remote process and according to, for example, a signal having one or more data packets (for example, data from two components interacting with another component in a local system, a distributed system, and/or across a network such as the Internet interacting with other systems by using the signal).

In addition, each embodiment is described with reference to an access terminal. An access terminal may also be referred to as a system, a subscriber unit, a subscriber station, a mobile station, a mobile, a remote station, a remote terminal, a mobile device, a user terminal, a terminal, a wireless communications device, user agent, a user apparatus, or UE (user equipment). The access terminal may be a cellular phone, a cordless phone, a SIP (Session Initiation Protocol) phone, a WLL (wireless local loop) station, a PDA (personal digital assistant), a handheld device having a wireless communications function, a computing device, or another processing device connected to a wireless modem. In addition, each embodiment is described with reference to a base station. A base station can be used to communicate with a mobile device; and the base station may be a BTS (base transceiver station) in GSM (Global System of Mobile Communications) or CDMA (Code Division Multiple Access); may be an NB (NodeB) in WCDMA (Wideband Code Division Multiple Access); or may be an eNB or eNodeB (evolved NodeB) in LTE (Long Term Evolution), a relay station or an access point, a base station device in a future 5G network, or the like.

In addition, aspects or features of the present disclosure may be implemented as a method, an apparatus or a product that uses standard programming and/or engineering technologies. The term "product" used in this application covers a computer program that can be accessed from any computer-readable component, carrier or medium. For example, the computer-readable medium may include but is not limited to: a magnetic storage component (for example, a hard disk, a floppy disk or a magnetic tape), an optical disc (for example, a CD (compact disk), a DVD (digital versatile disk), a smart card and a flash memory component (for example, EPROM (erasable programmable read-only memory), a card, a stick, or a key drive). In addition, various storage media described in this specification may indicate one or more devices and/or other machine-readable media that is used to store information. The term "machine-readable media" may include but is not limited to a radio channel, and various other media that can store, contain and/or carry an instruction and/or data.

Now, refer to FIG. 1, which shows a wireless communications system 100 according to embodiments described in this specification. The wireless communications system 100 includes a base station 102, and the base station 102 may include multiple antenna groups. Each antenna group may include one or more antennas. For example, an antenna group may include antennas 104 and 106, another antenna group may include antennas 108 and 110, and an additional group may include antennas 112 and 114. FIG. 1 shows two antennas for each antenna group, but more or fewer antennas may be used for each group. The base station 102 may additionally include a transmitter chain and a receiver chain. A person of ordinary skilled in the art may understand that both the transmitter chain and the receiver chain can include multiple components (such as processors, modulators, multiplexers, demodulators, demultiplexers, or antennas) related to signal transmission and reception.

The base station 102 may communicate with one or more access terminals (such as an access terminal 116 and an access terminal 122). However, it may be understood that the base station 102 may communicate with any quantity of access terminals similar to the access terminal 116 or 122. The access terminals 116 and 122 may be, for example, cellular phones, smartphones, portable computers, handheld communications devices, handheld computing devices, satellite radio apparatuses, global positioning systems, PDAs, and/or any other appropriate devices used for communication in the wireless communications system 100. As shown in the figure, the access terminal 116 communicates with the antennas 112 and 114, where the antennas 112 and 114 send information to the access terminal 116 by using a forward link 118, and receive information from the access terminal 116 by using a reverse link 120. In addition, the access terminal 122 communicates with the antennas 104 and 106, where the antennas 104 and 106 send information to the access terminal 122 by using a forward link 124, and receive information from the access terminal 122 by using a reverse link 126. In an FDD (frequency division duplex) system, for example, the forward link 118 may use a frequency band different from that used by the reverse link 120, and the forward link 124 may use a frequency band different from that used by the reverse link 126. In addition, in a TDD (time division duplex) system, the forward link 118 and the reverse link 120 may use a same frequency band, and the forward link 124 and the reverse link 126 may use a same frequency band.

Each antenna group and/or area designed for communication is referred to as a sector of the base station 102. For example, the antenna group may be designed to communicate with an access terminal in a sector of an area covered by the base station 102. In a process that the base station 102 respectively communicates with the access terminals 116 and 122 by using the forward links 118 and 124, a transmit antenna of the base station 102 may use beamforming to improve a signal-to-noise ratio of the forward links 118 and 124. In addition, when the base station 102 uses beamforming to send signals to the access terminals 116 and 122 that are distributed randomly in a related coverage area, a mobile device in a neighboring cell receives less interference, compared with a manner in which a base station uses a single antenna to send signals to all access terminals served by the base station.

In given duration, the base station 102, the access terminal 116 and/or the access terminal 122 may be a transmit wireless communications apparatus and/or a receive wireless communications apparatus. When sending data, the transmit wireless communications apparatus may encode data for transmission. Specifically, the transmit wireless communications apparatus may have (such as generate, obtain, and store in a memory) a specific quantity of information bits that are to be sent to the receive wireless communications apparatus by using a channel. This information bit may be included in a transport block (or multiple transport blocks) of the data, and the transport block may be segmented to produce multiple code blocks. In addition, the transmit wireless communications apparatus may use a polar encoder (not shown) to encode each code block.

Figure 2:
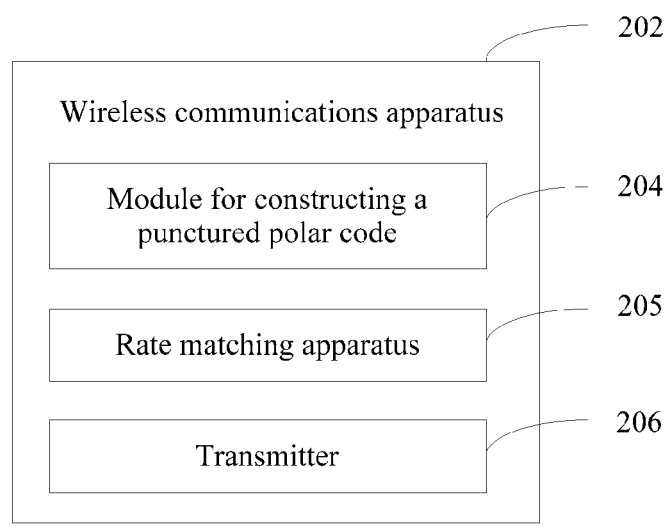
FIG. 2 is a schematic diagram of a system in which a method for constructing a punctured polar code of the present disclosure is performed in a wireless communications environment.

FIG. 2 shows a system to which a method for constructing a punctured polar code of the present disclosure is applicable in a wireless communications environment. The system includes a wireless communications apparatus 202. It is shown that the wireless communications apparatus 202 performs sending by using a channel. Although it is illustrated that the wireless communications apparatus 202 sends data, the wireless communications apparatus 202 may further receive data by using the channel (for example, the wireless communications apparatus 202 may send and receive data at the same time, the wireless communications apparatus 202 may send and receive data at different moments, or a combination thereof). For example, the wireless communications apparatus 202 may be a base station (such as the base station 102 in FIG. 1) or an access terminal (such as the access terminal 116 in FIG. 1 or the access terminal 122 in FIG. 1).

The wireless communications apparatus 202 may include a module 204 for constructing a punctured polar code, a rate matching apparatus 205, and a transmitter 206.

The module 204 for constructing a punctured polar code may be a polar encoder, configured to encode to-be-transmitted data to obtain a corresponding polar code. Alternatively, another module may be configured to construct a punctured polar code, which is not limited herein. The rate matching apparatus 205 is configured to determine output bits according to the corresponding polar code, and the transmitter 206 may subsequently transmit the output bits over the channel. For example, the transmitter 206 may send related data to another different wireless communications apparatus.

The following provides detailed description of a specific processing process of constructing the foregoing punctured polar code.

Figure 3:
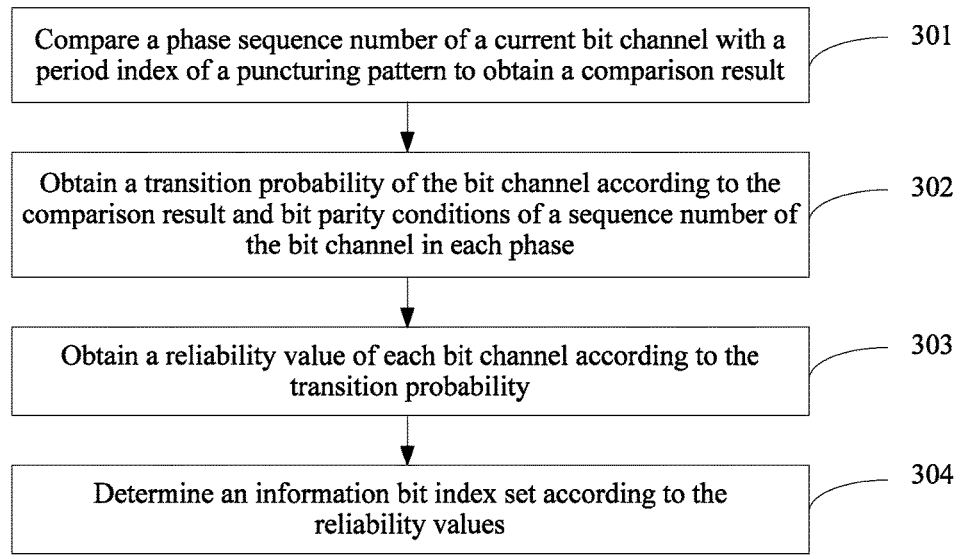
FIG. 3 is a schematic flowchart of a method for constructing a punctured polar code according to an embodiment of the present disclosure.

FIG. 3 is a schematic flowchart of a method for constructing a punctured polar code according to an embodiment of the present disclosure. The method shown in FIG. 3 may be performed by a module, (for example, a polar encoder) for constructing a punctured polar code, in a wireless communications device. The method includes:

301. Compare a phase sequence number of a current bit channel with a period index of a puncturing pattern to obtain a comparison result.

302. Obtain a transition probability of the bit channel according to the comparison result and bit parity conditions of a sequence number of the bit channel in each phase, where the bit parity condition indicates whether the sequence number of the bit channel is odd or even.

303. Obtain a reliability value of each bit channel according to the transition probability.

304. Determine an information bit index set according to the reliability values.

The polar code is the first code that can be theoretically proved that it can achieve the Shannon capacity and has low encoding-decoding complexity (encoding-decoding complexity is O(NlogN), where N is a code length). A brief description of encoding-decoding of the polar code is as follows:

The polar code is a linear block code, a generator matrix thereof is $G_N$, and an encoding process thereof is $X_1^N = u_1^N G_N$, where $G_N = B_N F^{\otimes n}$. $u_1^N = \{u_1, u_2, \ldots, u_N\}$ is a binary vector and represents a vector before encoding, $X_1^N$ represents a vector after encoding, and N represents a vector length, that is, the code length is N. For the code length $N=2^n$, $n \geq 0$, herein $$F = \begin{bmatrix} 1 & 0 \\ 1 & 1 \end{bmatrix},$$

and $B_N$ is a transposed matrix, for example, a bit reversal matrix. $F^{\otimes n}$ is a Kronecker power of F and is defined as $F^{\otimes n} = F \otimes F^{\otimes (n-1)}$.

The polar code may be represented as (N, K, A, $u_{A^c}$) by using a coset code, and an encoding process thereof is $x_1^N = u_A G_N(A) \oplus u_{A^c} G_N(A_x)$, where A herein is an information bit index set, $G_N(A)$ is a submatrix, in $G_N$, obtained from a row corresponding to an index in the set A, $G_N(A^C)$ is a submatrix, in $G_N$, obtained from a row corresponding to an index in a set $A^C$, and selection of the set A decides performance of the polar code. $u_{A^c}$ is a frozen bit, a quantity thereof is (N−K), and $u_{A^c}$ is a known bit. For simplicity, these frozen bits may be set to 0.

In step 301, the puncturing pattern is an input parameter for constructing the polar code. To represent the puncturing pattern more generally, a puncturing pattern of a broad-sense period may be used, and may be defined as follows: It is assumed that the code length of the polar code is $N=2^m$, and the puncturing pattern indicates that the puncturing pattern is a vector of a length $2^t$; and if $i \in \{0, 1, \ldots, 2^t-1\}$ is indicated, it indicates that locations of code symbols $c_j$ and $j \equiv i \mod 2^t$ are punctured, that is, the puncturing pattern is periodic, and the period is $2^t$, where j herein represents a phase sequence number.

The puncturing pattern of the broad-sense period may also be used to represent a non-periodic puncturing pattern; for example, if t=m, it may indicate that a puncturing pattern is non-periodic.

In an algorithm for constructing a punctured polar code, a phase sequence number j of the current bit channel, that is, an $i^{th}$ bit channel, may be compared with a period index t of the puncturing pattern to obtain the comparison result.

According to the comparison result of step 301, in step 302, a transition probability W of the $i^{th}$ bit channel is recursively obtained according to a first formula or a second formula and according to bit parity conditions of a binary representation of a sequence number i of the current bit channel in the phases, if the comparison result is that the phase sequence number j is less than or equal to the period index t.

The transition probability of the bit channel is obtained according to the first formula, if a bit of the binary representation of the sequence number of the bit channel in each phase corresponds to 0; or the transition probability of the bit channel is obtained according to the second formula, if a bit of the binary representation of the sequence number of the bit channel in each phase corresponds to 1.

The first formula herein includes:

$$(W_0 \otimes W_1)(y_0 y_1 \mid u_0) = \sum_{u_1 \in x} W_0(y_0 \mid u_0 + u_1) W_1(y_1 \mid u_1)$$

and the second formula includes:

$$(W_0 \oplus W_1)(y_0 y_1 u_0 | u_1) = W_0(y_0 | u_0 + u_1) W_1(y_1 | u_1)$$

where $W_0$ and $W_1$ represent transition probabilities of two channels corresponding to a polarization transformation basic unit of a punctured polar code, $y_0$ and $y_1$ represent channel output, and $u_0$ and $u_1$ represent input bits before encoding.

A transition probability W of the $i^{th}$ bit channel is obtained recursively according to a third formula or a fourth formula and according to bit parity conditions of a binary representation of a sequence number i of the bit channel in each phase, if the comparison result is that the phase sequence number j is greater than the period index t.

The transition probability of the bit channel is obtained according to the third formula, if a bit of the binary representation of the sequence number of the bit channel in each phase corresponds to 0; or the transition probability of the bit channel is obtained according to the fourth formula, if a bit of the binary representation of the sequence number of the bit channel in each phase corresponds to 1.

The third formula herein includes:

$$W_0^{(j)} \leftarrow Q_0^{(j-1)} \otimes Q_0^{(j-1)}$$

and the fourth formula includes:

$$W_0^{(j)} \leftarrow Q_0^{(j-1)} \oplus Q_0^{(j-1)}$$

where $W_0^{(j)}$ represents a transition probability for a $ji^{th}$ phase, $Q_0^{(j-1)}$ represents a transition probability for a $(j-1)^{th}$ phase, and j represents the phase sequence number.

The third formula and the fourth formula herein have a same formula for calculating a transition probability as a non-punctured polar code.

In this way, after a transition probability of each bit channel is obtained, in step 303, because noise always exists on a channel, an error is inevitable in an information transmission process. After the transition probability of each bit channel is obtained, the reliability value of each bit channel can be obtained according to the transition probability. The reliability value may include the Bhattacharyya parameter, an error probability, or the Bhattacharyya parameter and an error probability. The error probability is an error probability of incorrectly shifting a bit 0 to 1 or incorrectly shifting 1 to 0. An implementation manner herein of obtaining the error probability according to the transition probability can be understood by a person skilled in the art, which is not repeatedly described. In addition, the Bhattacharyya parameter of each bit channel can further be obtained according to the transition probability.

An implementation manner of obtaining the Bhattacharyya parameter corresponding to each bit channel according to the transition probability W may be: according to a comparison method in step 301, obtaining the Bhattacharyya parameter according to a fifth formula, if the comparison result is that the phase sequence number is less than or equal to the period index, and the bit of the binary representation of the sequence number of the bit channel in each phase corresponds to 0;

obtaining the Bhattacharyya parameter according to a sixth formula, if the comparison result is that the phase sequence number is less than or equal to the period index, and the bit of the binary representation of the sequence number of the bit channel in each phase corresponds to 1;

obtaining the Bhattacharyya parameter according to a seventh formula, if the comparison result is that the phase sequence number is greater than the period index, and the bit of the binary representation of the sequence number of the bit channel in each phase corresponds to 0; or obtaining the Bhattacharyya parameter according to an eighth formula, if the comparison result is that the phase sequence number is greater than the period index, and the bit of the binary representation of the sequence number of the bit channel in each phase corresponds to 1.

The fifth formula includes:

$$Z(W_0 \otimes W_1) \leq Z(W_0) + Z(W_1)$$

and the sixth formula includes:

$$Z(W_0 \oplus W_1) = Z(W_0) Z(W_1)$$

where $W_0$ and $W_1$ represent transition probabilities of two channels corresponding to a polarization transformation basic unit of a punctured polar code, and Z represents the Bhattacharyya parameter; and the seventh formula includes:

$$Z_0^{(j)} \leftarrow \min\{Z(W_0^{(j)}, 2Z_0^{(j-1)} - (Z_0^{(j-1)})^2)\}$$

and the eighth formula includes:

$$Z_0^{(j)} \leftarrow (Z_0^{(j-1)})^2\}$$

where $W_0^{(j)}$ represents a transition probability for a $j^{th}$ phase, $Z_0^{(j)}$ represents the Bhattacharyya parameter for the $i^{th}$ phase, and $Z_0^{(j-1)}$ represents the Bhattacharyya parameter for a $(j-1)^{th}$ phase.

After the Bhattacharyya parameter and the error probability of each bit channel are obtained, in step 304, the error probabilities may be sorted in ascending order, and a bit index set A is formed according to sequence numbers corresponding to bit channels of the first K error probabilities; the Bhattacharyya parameters are sorted in ascending order, and the information bit index set is formed according to sequence numbers corresponding to bit channels of the first K Bhattacharyya parameters; or the smaller one of the error probability and the Bhattacharyya parameter of each bit channel is selected, the selected smaller ones are sorted in ascending order, and sequence numbers of bit channels corresponding to the first K smaller ones are selected to form the information bit index set. For example, if an error probability of a bit channel is 1/1000, and the Bhattacharyya parameter is 2/1000, 1/1000 is selected for sorting the bit channel.

A value of K herein is preset and known, and K may be selected according to a code rate or a code length of channel encoding-decoding.

In this way, for the algorithm for constructing a punctured polar code, during obtaining of the information bit index set A, the error probability or the Bhattacharyya parameter of each bit channel is obtained, so that sequence numbers of bit channels of the first K error probabilities and/or Bhattacharyya parameters are selected as the information bit index set A, and a transmitter and a receiver in a communications device can perform encoding and decoding according to the information bit index set A.

Figure 4:
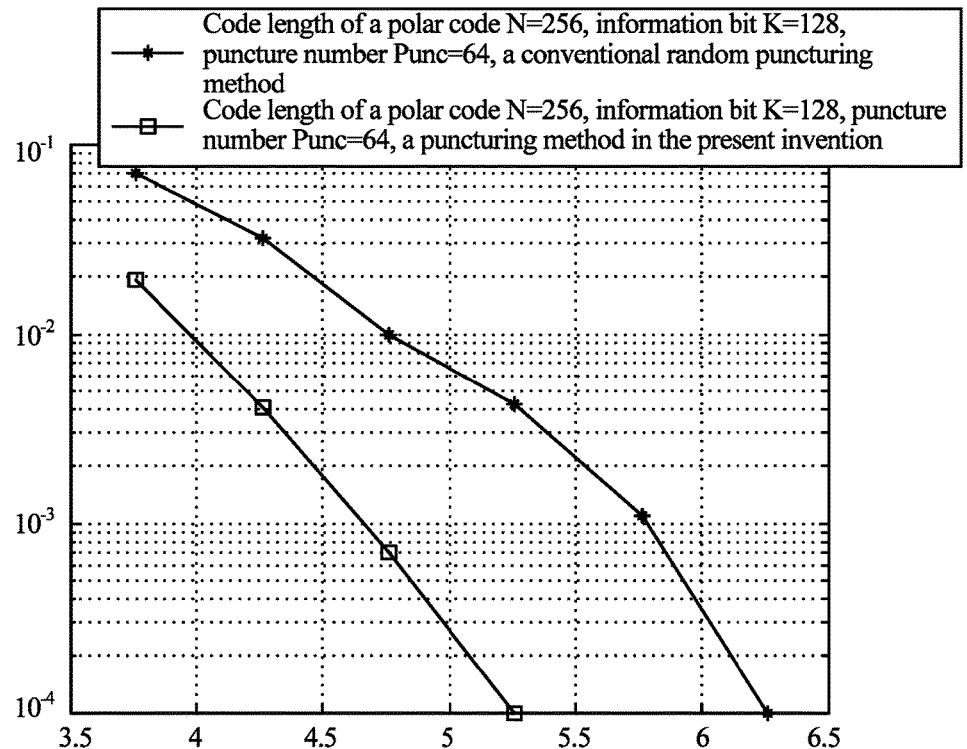
FIG. 4 is a schematic diagram of a frame error rate FER curve comparison between random puncturing and an algorithm for constructing a punctured polar code in an embodiment of the present disclosure according to an embodiment of the present disclosure.

FIG. 4 shows a frame error rate FER curve comparison between random puncturing and an algorithm for constructing a punctured polar code in this embodiment of the present disclosure, where SC decoding is used. The curve with * is for the case in which a conventional random puncturing method is used, and the curve with □ is for the case in which a puncturing method in this embodiment of the present disclosure is used. The horizontal axis indicates a bit signal-to-noise ratio (Eb/N0), and the vertical axis indicates an FER value. It can be seen that by using the algorithm for constructing a punctured polar code in this embodiment of the present disclosure, FER performance of a punctured polar code can be improved and a frame error rate of the punctured polar code can be reduced. For example, if a code length N=256, K=128, and a puncture number=64, when FER=10^(−2), performance of a punctured polar code constructed by using the algorithm in this embodiment of the present disclosure is 0.7 dB better than performance of a randomly punctured polar code, where the puncture number indicates the number of punctured bits. The FER reflects comprehensive forward link quality, and is a frame transmission error probability in a data transmission process. For example, for a base station and a mobile phone user, a smaller FER indicates that a link on which the mobile phone is located is better, and a signal received from the base station is better.

Therefore, in the method for constructing a punctured polar code provided in this embodiment of the present disclosure, a phase sequence number of a current bit channel is compared with a period index of a puncturing pattern to obtain a comparison result, where the puncturing pattern is used to produce an input parameter of the polar code; a transition probability of the bit channel is recursively obtained according to the comparison result and bit parity conditions of a binary representation of a sequence number of the bit channel in each phase; an error probability of each bit channel is obtained according to the transition probability, the error probabilities are sorted in ascending order, and sequence numbers corresponding to bit channels of the first K error probabilities are selected to form an information bit index set, so that a receiver of a terminal performs decoding according to the information bit index set constructed by a punctured polar code in this embodiment of the present disclosure, which can improve decoding performance of the polar code.

Figure 5:
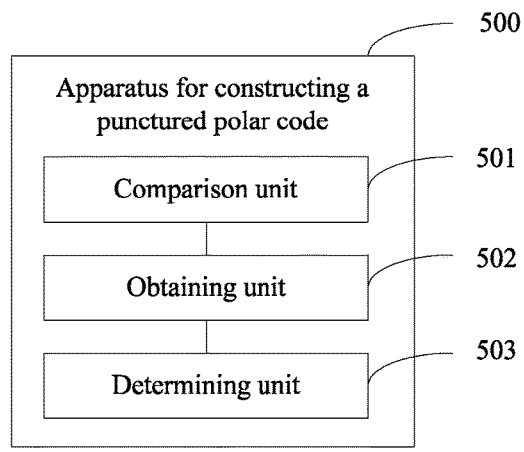
FIG. 5 is a block diagram of an apparatus for constructing a punctured polar code according to an embodiment of the present disclosure.

FIG. 5 is a block diagram of an apparatus 500 for constructing a punctured polar code according to an embodiment of the present disclosure. The apparatus may be located on a mobile user terminal, a base station, or the like. The apparatus may include a processor and a non-transitory storage medium configured to store units that include a comparison unit 501, an obtaining unit 502, and a determining unit 503.

The comparison unit 501 is configured to compare a phase sequence number of a current bit channel with a period index of a puncturing pattern to obtain a comparison result. The obtaining unit 502 is configured to obtain a transition probability of the bit channel according to the comparison result and bit parity conditions of a sequence number of the bit channel in each phase. The obtaining unit 502 is further configured to obtain a reliability value of each bit channel according to the transition probability. The determining unit 503 is configured to determine an information bit index set according to the reliability values.

The reliability value herein may include the Bhattacharyya parameter, an error probability, or the Bhattacharyya parameter and an error probability.

Alternatively or additionally, the reliability value includes the Bhattacharyya parameter, and the determining unit 503 is configured to:

sort the Bhattacharyya parameters in ascending order, and form the information bit index set according to sequence numbers corresponding to bit channels of the first K Bhattacharyya parameters, where K is a positive integer less than or equal to a total quantity of the bit channels.

Alternatively or additionally, the reliability value includes the error probability, and the determining unit 503 is configured to:

sort the error probabilities in ascending order, and form the information bit index set according to sequence numbers corresponding to bit channels of the first K error probabilities, where K is a positive integer less than or equal to a total quantity of the bit channels.

Alternatively or additionally, the reliability value includes the Bhattacharyya parameter and the error probability, and the determining unit 503 is configured to:

select the smaller one of the error probability and the Bhattacharyya parameter of each bit channel, sort the selected smaller ones in ascending order, and select sequence numbers of bit channels corresponding to the first K smaller ones to form the information bit index set, where K is a positive integer less than or equal to a total quantity of the bit channels.

Alternatively or additionally, the obtaining unit 502 may be configured to:

obtain the transition probability of the bit channel according to a first formula or a second formula and according to bit parity conditions of a binary representation of the sequence number of the bit channel in each phase, if the comparison result is that the phase sequence number is less than or equal to the period index; or obtain the transition probability of the bit channel according to a third formula or a fourth formula and according to bit parity conditions of a binary representation of the sequence number of the bit channel in each phase, if the comparison result is that the phase sequence number is greater than the period index.

Alternatively or additionally, if the comparison result is that the phase sequence number is less than or equal to the period index, the obtaining unit 502 may be configured to:

obtain the transition probability according to the first formula, if a bit of the binary representation of the sequence number of the bit channel in each phase corresponds to 0; or obtain the transition probability according to the second formula, if a bit of the binary representation of the sequence number of the bit channel in each phase corresponds to 1.

The first formula includes:

$$(W_0 \otimes W_1)(y_0 y_1 \mid u_0) = \sum_{u_1 \in x} W_0(y_0 \mid u_0 + u_1) W_1(y_1 \mid u_1)$$

and the second formula includes:

$$(W_0 \oplus W_1)(y_0 y_1 u_0 \mid u_1) = W_0(y_0 \mid u_0 + u_1) W_1(y_1 \mid u_1)$$

where $W_0$ and $W_1$ represent transition probabilities of two channels corresponding to a polarization transformation basic unit of a punctured polar code, $y_0$ and $y_1$ represent channel output, and $u_0$ and $u_1$ represent input bits before encoding.

Alternatively or additionally, if the comparison result is that the phase sequence number is greater than the period index, the obtaining unit 502 may be configured to:

obtain the transition probability according to the third formula, if a bit of the binary representation of the sequence number of the bit channel in each phase corresponds to 0; or obtain the transition probability according to the fourth formula, if a bit of the binary representation of the sequence number of the bit channel in each phase corresponds to 1.

The third formula includes:

$$W_0^{(j)} \leftarrow Q_0^{(j-1)} \otimes Q_0^{(j-1)}$$

and the fourth formula includes:

$$W_0^{(j)} \leftarrow Q_0^{(j-1)} \oplus Q_0^{(j-1)}$$

where $W_0^{(j)}$ represents a transition probability for a $j^{th}$ phase, $Q_0^{(j-1)}$ represents a transition probability for a $(j-1)^{th}$ phase, and j represents the phase sequence number.

Alternatively or additionally, the obtaining unit 502 may be configured to:

obtain the Bhattacharyya parameter according to a fifth formula, if the comparison result is that the phase sequence number is less than or equal to the period index, and the bit of the binary representation of the sequence number of the bit channel in each phase corresponds to 0;

obtain the Bhattacharyya parameter according to a sixth formula, if the comparison result is that the phase sequence number is less than or equal to the period index, and the bit of the binary representation of the sequence number of the bit channel in each phase corresponds to 1;

obtain the Bhattacharyya parameter according to a seventh formula, if the comparison result is that the phase sequence number is greater than the period index, and the bit of the binary representation of the sequence number of the bit channel in each phase corresponds to 0; or obtain the Bhattacharyya parameter according to an eighth formula, if the comparison result is that the phase sequence number is greater than the period index, and the bit of the binary representation of the sequence number of the bit channel in each phase corresponds to 1.

The fifth formula includes:

$$Z(W_0 \otimes W_1) \leq Z(W_0) + Z(W_1)$$

and the sixth formula includes:

$$Z(W_0 \oplus W_1) = Z(W_0)Z(W_1)$$

where $W_0$ and $W_1$ represent transition probabilities of two channels corresponding to a polarization transformation basic unit of a punctured polar code, and Z represents the Bhattacharyya parameter; and the seventh formula includes:

$$Z_0^{(j)} \leftarrow \min\{Z(W_0^{(j)}, 2Z_0^{(j-1)} - (Z_0^{(j-1)})^2)\}$$

and the eighth formula includes:

$$Z_0^{(j)} \leftarrow (Z_0^{(j-1)})^2\}$$

where $W_0^{(j)}$ represents a transition probability for a $j^{th}$ phase, $Z_0^{(j)}$ represents the Bhattacharyya parameter for the $j^{th}$ phase, and $Z_0^{(j-1)}$ represents the Bhattacharyya parameter for a $(j-1)^{th}$ phase.

According to the apparatus for constructing a punctured polar code provided in this embodiment of the present disclosure, a phase sequence number of a current bit channel is compared with a period index of a puncturing pattern to obtain a comparison result, where the puncturing pattern is an input parameter for constructing the polar code; a transition probability of the bit channel is recursively obtained according to the comparison result and bit parity conditions of a binary representation of a sequence number of the bit channel in each phase; the Bhattacharyya parameter and an error probability of each bit channel are obtained according to the transition probability; and an information bit index set is determined according to the Bhattacharyya parameters and/or the error probabilities, so that a receiver performs decoding according to the information bit index set constructed by a punctured polar code in this embodiment of the present disclosure, which can improve decoding performance of the polar code.

Figure 6:
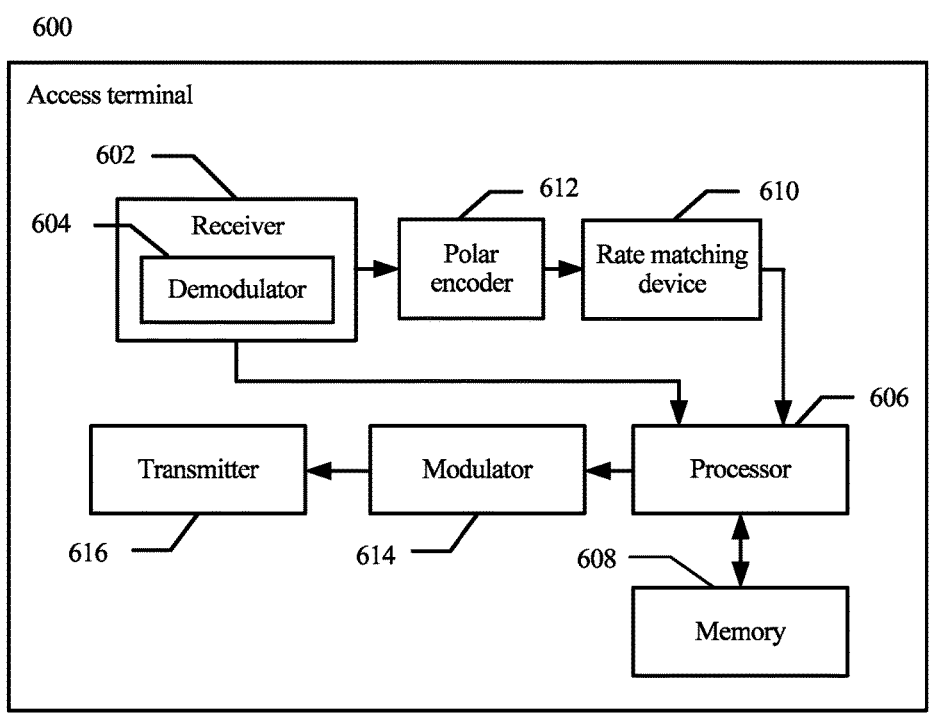
FIG. 6 is a schematic diagram of an access terminal, which is helpful in executing a method for constructing a punctured polar code, in a wireless communications system.

FIG. 6 is a schematic diagram of an access terminal 600, which is helpful in executing the foregoing method for constructing a punctured polar code, in a wireless communications system. The access terminal 600 includes a receiver 602, where the receiver 602 is configured to receive a signal from, for example, a receive antenna (not shown), perform a typical action (such as filtering, amplifying, and down-conversion) on the received signal, and digitalize an adjusted signal to obtain a sample. The receiver 602 may be, for example, an MMSE (minimum mean square error) receiver. The access terminal 600 may further include a demodulator 604, where the demodulator 604 may be configured to demodulate a received symbol and provide the symbol to a processor 606 for channel estimation. The processor 606 may be: a processor that is specially configured to analyze information received by the receiver 602 and/or generate information to be sent by a transmitter 616; a processor configured to control one or more components of the access terminal 600; and/or a controller that is configured to analyze information received by the receiver 602, generate information to be sent by a transmitter 616, and control one or more components of the access terminal 600.

The access terminal 600 may additionally include a memory 608. The memory 608 may be operatively coupled to the processor 606, and store the following data: data to be sent, data received, and any other proper information related to execution of various actions and functions described in this specification. The memory 608 may additionally store a protocol and/or an algorithm that are/is related to polar code processing.

It can be understood that a data storage apparatus (such as the memory 608) described in this specification may be a volatile memory or a non-volatile memory, or may include both of a volatile memory and a non-volatile memory. Exemplary but not restrictive, the non-volatile memory may include: a ROM (read-only memory), a PROM (programmable read-only memory), an EPROM (erasable programmable read-only memory), an EEPROM (electrically erasable programmable read-only memory), or a flash memory. The volatile memory may include: a RAM (random access memory), which is used as an external cache. Exemplary but not restrictive, RAMs of many forms are applicable, such as an SRAM (static random access memory), a DRAM (dynamic random access memory), an SDRAM (synchronous dynamic random access memory), a DDR SDRAM (double data rate synchronous dynamic random access memory), an ESDRAM (enhanced synchronous dynamic random access memory), an SLDRAM (synchlink dynamic random access memory), and a DR RAM (direct rambus random access memory). The memory 608 in both a system and a method described in this specification aims to include but is not limited to these memories and a memory of another proper type.

In actual application, the access terminal 600 may include a polar encoder. The polar encoder 612 is basically similar to the polar encoder 204 in FIG. 2, and may be configured to: compare a phase sequence number of a current bit channel with a period index of a puncturing pattern to obtain a comparison result; obtain a transition probability of the bit channel according to the comparison result and bit parity conditions of a sequence number of the bit channel in each phase; obtain a reliability value of each bit channel according to the transition probability; and determine an information bit index set according to the reliability values.

The reliability value may include the Bhattacharyya parameter, an error probability, or the Bhattacharyya parameter and an error probability.

Alternatively or additionally, in an embodiment, a transition probability W of an $i^{th}$ bit channel is obtained according to a first formula or a second formula and according to bit parity conditions of a binary representation of a sequence number i of the current bit channel in the phases, if the comparison result is that a phase sequence number j is less than or equal to a period index t.

The transition probability of the bit channel is obtained according to the first formula, if a bit of the binary representation of the sequence number of the bit channel in each phase corresponds to 0; or the transition probability of the bit channel is obtained according to the second formula, if a bit of the binary representation of the sequence number of the bit channel in each phase corresponds to 1.

The first formula herein includes:

$$(W_0 \otimes W_1)(y_0 y_1 \mid u_0) = \sum_{u_1 \in x} W_0(y_0 \mid u_0 + u_1) W_1(y_1 \mid u_1)$$

and the second formula includes:

$$(W_0 \oplus W_1)(y_0 y_1 u_0 \mid u_1) = W_0(y_0 \mid u_0 + u_1) W_1(y_1 \mid u_1)$$

where $W_0$ and $W_1$ represent transition probabilities of two channels corresponding to a polarization transformation basic unit of a punctured polar code, $y_0$ and $y_1$ represent channel output, and $u_0$ and $u_1$ represent input bits before encoding.

A transition probability W is obtained according to a third formula or a fourth formula and according to bit parity conditions of a binary representation of a sequence number i of the bit channel in each phase, if the comparison result is that a phase sequence number j is greater than a period index t.

The transition probability of the bit channel is obtained according to the third formula, if a bit of the binary representation of the sequence number of the bit channel in each phase corresponds to 0; or the transition probability of the bit channel is obtained according to the fourth formula, if a bit of the binary representation of the sequence number of the bit channel in each phase corresponds to 1.

The third formula herein includes:

$$W_0^{(j)} \leftarrow Q_0^{(j-1)} \otimes Q_0^{(j-1)}$$

and the fourth formula includes:

$$W_0^{(j)} \leftarrow Q_0^{(j-1)} \oplus Q_0^{(j-1)}$$

where $W_0^{(j-1)}$ represents a transition probability for a $j^{th}$ phase, $Q_0^{(j-1)}$ represents a transition probability for a $(j-1)^{th}$ phase, and j represents the phase sequence number.

The third formula and the fourth formula herein have a same formula for calculating a transition probability as a non-punctured polar code.

Alternatively or additionally, after the polar encoder obtains the transition probability of each bit channel, because noise always exists on a channel, an error is inevitable in an information transmission process. After the transition probability of each bit channel is obtained, the error probability of incorrectly shifting a bit 0 to 1 or incorrectly shifting 1 to 0 of each bit channel can be obtained according to the transition probability. An implementation manner herein of obtaining the error probability according to the transition probability can be understood by a person skilled in the art, which is not repeatedly described. In addition, the Bhattacharyya parameter of each bit channel can further be obtained according to the transition probability.

An implementation manner of obtaining the Bhattacharyya parameter corresponding to each bit channel according to the transition probability W may be: according to a comparison method in step 301, obtaining the Bhattacharyya parameter according to a fifth formula, if the comparison result is that the phase sequence number is less than or equal to the period index, and the bit of the binary representation of the sequence number of the bit channel in each phase corresponds to 0;

obtaining the Bhattacharyya parameter according to a sixth formula, if the comparison result is that the phase sequence number is less than or equal to the period index, and the bit of the binary representation of the sequence number of the bit channel in each phase corresponds to 1;

obtaining the Bhattacharyya parameter according to a seventh formula, if the comparison result is that the phase sequence number is greater than the period index, and the bit of the binary representation of the sequence number of the bit channel in each phase corresponds to 0; or obtaining the Bhattacharyya parameter according to an eighth formula, if the comparison result is that the phase sequence number is greater than the period index, and the bit of the binary representation of the sequence number of the bit channel in each phase corresponds to 1.

The fifth formula includes:

$$Z(W_0 \otimes W_1) \leq Z(W_0) + Z(W_1)$$

and the sixth formula includes:

$$Z(W_0 \oplus W_1) = Z(W_0) Z(W_1)$$

where $W_0$ and $W_1$ represent transition probabilities of two channels corresponding to a polarization transformation basic unit of a punctured polar code, and Z represents the Bhattacharyya parameter; and the seventh formula includes:

$$Z_0^{(j)} \leftarrow \min\{Z(W_0^{(j)}, 2Z_0^{(j-1)} - (Z_0^{(j-1)})^2)\}$$

and the eighth formula includes:

$$Z_0^{(j)} \leftarrow (Z_0^{(j-1)})^2\}$$

where $W_0^{(j)}$ represents a transition probability for a $j^{th}$ phase, $Z_0^{(j)}$ represents the Bhattacharyya parameter for the $j^{th}$ phase, and $Z_0^{(j-1)}$ represents the Bhattacharyya parameter for a $(j-1)^{th}$ phase.

Alternatively or additionally, after the Bhattacharyya parameter and the error probability of each bit channel are obtained, the error probabilities may be sorted in ascending order, and a bit index set A is formed according to sequence numbers corresponding to bit channels of the first K error probabilities; the Bhattacharyya parameters are sorted in ascending order, and the information bit index set is formed according to sequence numbers corresponding to bit channels of the first K Bhattacharyya parameters; or the smaller one of the error probability and the Bhattacharyya parameter of each bit channel is selected, the selected smaller ones are sorted in ascending order, and sequence numbers of bit channels corresponding to the first K smaller ones are selected to form the information bit index set.

In addition, the access terminal 600 may further include a modulator 614 and the transmitter 616, where the transmitter 616 is further configured to send a signal to a base station, another access terminal, or the like. Although it is illustrated that the polar encoder 612, a rate matching device 610, and/or the modulator 614 are independent of the processor 606, it should be understood that the polar encoder 612, the rate matching device 610, and/or the modulator 614 may be a part of the processor 606 or multiple processors (not shown). In actual application, the receiver 602 and the transmitter 616 may also be integrated to constitute one transceiver.

Figure 7:
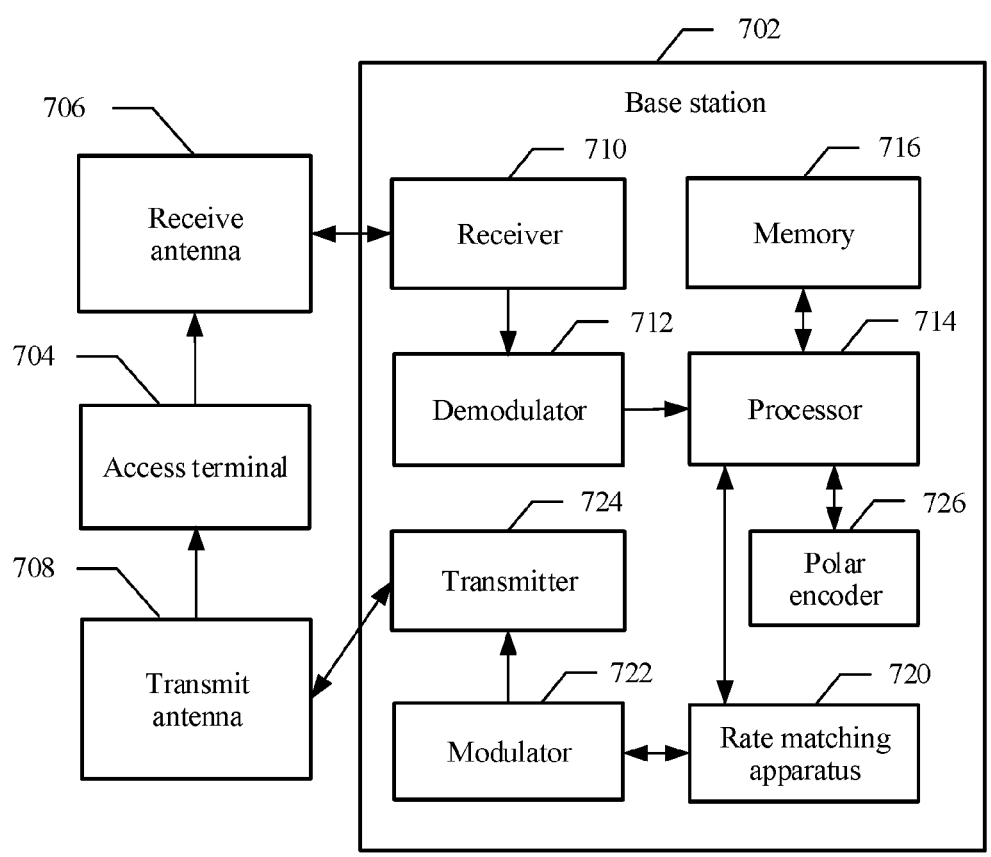
FIG. 7 is a schematic diagram of an exemplary system, in which a method for constructing a punctured polar code is performed, in a wireless communications environment.

FIG. 7 is a schematic diagram of an exemplary system, in which a method for constructing a punctured polar code is performed, in a wireless communications environment. A base station 702 (such as an access point, an NB, or an eNB) is included. The base station 702 has a receiver 710 that receives a signal from one or more access terminals 704 by using multiple receive antennas 706, and has a transmitter 724 that transmits a signal to the one or more access terminals 704 by using a transmit antenna 708. Generally, "a receive antenna" and "a transmit antenna" may be integrated to constitute one receive-transmit antenna. The receiver 710 may receive information from the receive antenna 706, and may be operatively associated with a demodulator 712 that performs demodulation on the received information. A demodulated symbol is analyzed by using a processor 714. The processor 714 is connected to a memory 716, where the memory 716 is configured to store data that is to be sent to the access terminal 704 (or a different base station (not shown)), or data received from the access terminal 704 (or a different base station (not shown)), and/or any other proper information related to execution of various actions and functions described in this specification. The processor 714 may be further coupled to a polar encoder 726 to compare a phase sequence number of a current bit channel with a period index of a puncturing pattern to obtain a comparison result; recursively obtain a transition probability of the bit channel according to the comparison result and bit parity conditions of a binary representation of a sequence number of the bit channel in each phase; obtain the Bhattacharyya parameter and an error probability of each bit channel according to the transition probability; and determine an information bit index set according to the Bhattacharyya parameters and/or the error probabilities.

Alternatively or additionally, a reliability value includes the Bhattacharyya parameter; and determining the information bit index set according to the reliability value includes:

sorting the Bhattacharyya parameters in ascending order, and forming the information bit index set according to sequence numbers corresponding to bit channels of the first K Bhattacharyya parameters, where K is a positive integer less than or equal to a total quantity of the bit channels.

Alternatively or additionally, a reliability value includes the error probability; and determining the information bit index set according to the reliability value includes:

sorting the error probabilities in ascending order, and forming the information bit index set according to sequence numbers corresponding to bit channels of the first K error probabilities, where K is a positive integer less than or equal to a total quantity of the bit channels.

Alternatively or additionally, a reliability value includes the Bhattacharyya parameter and the error probability; and determining the information bit index set according to the reliability value includes:

selecting the smaller one of the error probability and the Bhattacharyya parameter for each bit channel, sorting the selected smaller ones in ascending order, and selecting sequence numbers of bit channels corresponding to the first K smaller ones to form the information bit index set, where K is a positive integer less than or equal to a total quantity of the bit channels.

Alternatively or additionally, in an embodiment, a transition probability W of an $i^{th}$ bit channel is obtained according to a first formula or a second formula and according to bit parity conditions of a binary representation of a sequence number i of the current bit channel in the phases, if the comparison result is that a phase sequence number j is less than or equal to a period index t.

The transition probability of the bit channel is obtained according to the first formula, if a bit of the binary representation of the sequence number of the bit channel in each phase corresponds to 0; or the transition probability of the bit channel is obtained according to the second formula, if a bit of the binary representation of the sequence number of the bit channel in each phase corresponds to 1.

The first formula herein includes:

$$(W_0 \otimes W_1)(y_0 y_1 \mid u_0) = \sum_{u_1 \in x} W_0(y_0 \mid u_0 + u_1) W_1(y_1 \mid u_1)$$

and the second formula includes:

$$(W_0 \oplus W_1)(y_0 y_1 u_0 \mid u_1) = W_0(y_0 \mid u_0 + u_1) W_1(y_1 \mid u_1)$$

where $W_0$ and $W_1$ represent transition probabilities of two channels corresponding to a polarization transformation basic unit of a punctured polar code, $y_0$ and $y_1$ represent channel output, and $u_0$ and $u_1$ represent input bits before encoding.

A transition probability W is obtained according to a third formula or a fourth formula and according to bit parity conditions of a binary representation of a sequence number i of the bit channel in each phase, if the comparison result is that a phase sequence number j is greater than a period index t.

The transition probability of the bit channel is obtained according to the third formula, if a bit of the binary representation of the sequence number of the bit channel in each phase corresponds to 0; or the transition probability of the bit channel is obtained according to the fourth formula, if a bit of the binary representation of the sequence number of the bit channel in each phase corresponds to 1.

The third formula herein includes:

$$W_0^{(j)} \leftarrow Q_0^{(j-1)} \otimes Q_0^{(j-1)}$$

and the fourth formula includes:

$$W_0^{(j)} \leftarrow Q_0^{(j-1)} \oplus Q_0^{(j-1)}$$

where $W_0^{(j)}$ represents a transition probability for a $j^{th}$ phase, $Q_0^{(j-1)}$ represents a transition probability for a $(j-1)^{th}$ phase, and j represents the phase sequence number.

The third formula and the fourth formula herein have a same formula for calculating a transition probability as a non-punctured polar code.

Alternatively or additionally, after the polar encoder obtains the transition probability of each bit channel, because noise always exists on a channel, an error is inevitable in an information transmission process. After the transition probability of each bit channel is obtained, the error probability of each bit channel can be obtained according to the transition probability. The error probability is an error probability of incorrectly shifting a bit 0 to 1 or incorrectly shifting 1 to 0. An implementation manner herein of obtaining the error probability according to the transition probability can be understood by a person skilled in the art, which is not repeatedly described. In addition, the Bhattacharyya parameter of each bit channel can further be obtained according to the transition probability.

An implementation manner of obtaining the Bhattacharyya parameter corresponding to each bit channel according to the transition probability W may be: according to a comparison method in step 301, obtaining the Bhattacharyya parameter according to a fifth formula, if the comparison result is that the phase sequence number is less than or equal to the period index, and the bit of the binary representation of the sequence number of the bit channel in each phase corresponds to 0;

obtaining the Bhattacharyya parameter according to a sixth formula, if the comparison result is that the phase sequence number is less than or equal to the period index, and the bit of the binary representation of the sequence number of the bit channel in each phase corresponds to 1;

obtaining the Bhattacharyya parameter according to a seventh formula, if the comparison result is that the phase sequence number is greater than the period index, and the bit of the binary representation of the sequence number of the bit channel in each phase corresponds to 0; or obtaining the Bhattacharyya parameter according to an eighth formula, if the comparison result is that the phase sequence number is greater than the period index, and the bit of the binary representation of the sequence number of the bit channel in each phase corresponds to 1.

The fifth formula includes:

$$Z(W_0 \otimes W_1) \leq Z(W_0) + Z(W_1)$$

and the sixth formula includes:

$$Z(W_0 \oplus W_1) = Z(W_0)Z(W_1)$$

where $W_0$ and $W_1$ represent transition probabilities of two channels corresponding to a polarization transformation basic unit of a punctured polar code, and Z represents the Bhattacharyya parameter; and the seventh formula includes:

$$Z_0^{(j)} \leftarrow \min\{Z(W_0^{(j)}, 2Z_0^{(j-1)} - (Z_0^{(j-1)})^2)\}$$

and the eighth formula includes:

$$Z_0^{(j)} \leftarrow (Z_0^{(j-1)})^2\}$$

where $W_0^{(j)}$ represents a transition probability for a $j^{th}$ phase, $Z_0^{(j)}$ represents the Bhattacharyya parameter for the $j^{th}$ phase, and $Z_0^{(j-1)}$ represents the Bhattacharyya parameter for a $(j-1)^{th}$ phase.

Alternatively or additionally, after the Bhattacharyya parameter and the error probability of each bit channel are obtained, the error probabilities may be sorted in ascending order, and a bit index set A is formed according to sequence numbers corresponding to bit channels of the first K error probabilities; the Bhattacharyya parameters are sorted in ascending order, and the information bit index set is formed according to sequence numbers corresponding to bit channels of the first K Bhattacharyya parameters; or the smaller one of the error probability and the Bhattacharyya parameter of each bit channel is selected, the selected smaller ones are sorted in ascending order, and sequence numbers of bit channels corresponding to the first K smaller ones are selected to form the information bit index set.

In addition, the access terminal may further include a modulator 722 and a transmitter 724, where the transmitter 724 is configured to send a signal to a base station, another access terminal, or the like. Although it is illustrated that the polar encoder 726, a rate matching device 720, and/or the modulator 722 are independent of the processor 714, it should be understood that the polar encoder 726, the rate matching device 720, and/or the modulator 722 may be a part of the processor 714 or multiple processors (not shown).

In addition, in a system, the modulator 722 may modulate a frame, and the transmitter 724 sends, by using the antenna 706, the frame modulated by the modulator 722 to the access terminal 704. Although it is illustrated that the polar encoder 726, the rate matching device 720, and/or the modulator 722 are independent of the processor 714, it should be understood that the polar encoder 726, the rate matching device 720, and/or the modulator 722 may be a part of the processor 714 or multiple processors (not shown).

It may be understood that the embodiments described in this specification may be implemented by hardware, software, firmware, middleware, microcode or a combination thereof. For hardware implementation, a processing unit may be implemented in another electronic unit for executing the functions described in this application and a combination thereof, such as one or more ASICs (application specific integrated circuit), a DSP (digital signal processor), a DSPD (digital signal processing device), a PLD (programmable logic device), an FPGA (field-programmable gate array), a processor, a controller, a microcontroller, a microprocessor, and a chip.

When the embodiments are implemented in software, firmware, middleware, microcode, program code, or a code segment, they may be stored in a machine-readable medium of, for example, a storage component. The code segment may represent a process, a function, a subprogram, a program, a routine, a subroutine, a module, a software group, a class, or any combination of instructions, data structures or program statements. The code segment may be coupled to another code segment or hardware circuit by transmitting and/or receiving information, data, an independent variable, a parameter, or memory content. The information, the independent variable, the parameter, the data, and the like may be transferred, forwarded, or sent in any suitable manner including memory sharing, message transfer, token transfer, network transmission, and the like.

For software implementation, the technology described in this specification may be implemented by using modules for executing the functions (for example, a process or a function) described in this specification. Software code may be stored in a memory and executed by a processor. A memory unit may be implemented inside a processor or outside a processor, and in the latter case, the memory unit may be coupled to the processor in a communication manner through various means known in the art.

According to the apparatus for constructing a punctured polar code provided in this embodiment of the present disclosure, a phase sequence number of a current bit channel is compared with a period index of a puncturing pattern to obtain a comparison result, where the puncturing pattern is an input parameter for constructing the polar code; a transition probability of the bit channel is recursively obtained according to the comparison result and bit parity conditions of a binary representation of a sequence number of the bit channel in each phase; the Bhattacharyya parameter and an error probability of each bit channel are obtained according to the transition probability; and an information bit index set is determined according to the Bhattacharyya parameters and/or the error probabilities, so that a receiver performs decoding according to the information bit index set constructed by a punctured polar code in this embodiment of the present disclosure, which can improve decoding performance of the polar code.

Figure 8:
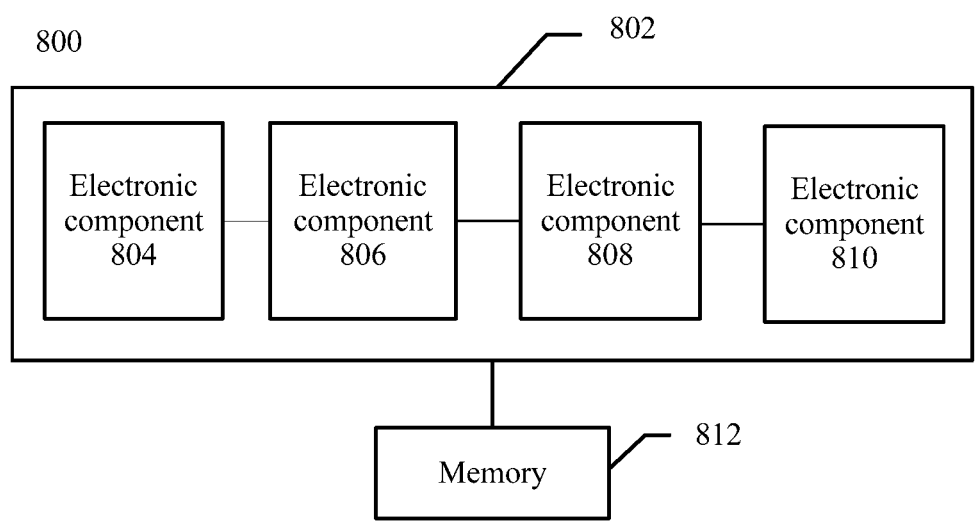
FIG. 8 is a schematic diagram of a system in which a method for constructing a punctured polar code can be used in a wireless communications environment.

Refer to FIG. 8, which shows a system 800 in which a method for constructing a punctured polar code may be used in a wireless communications environment. For example, the system 800 may at least partially reside on a base station. According to another example, the system 800 may at least partially reside on an access terminal. It should be understood, the system 800 may include a functional block, which may represent a functional block of functions implemented by a processor, software, or a combination thereof (for example, firmware). The system 800 includes a logical group 802 that has electronic components that can operate jointly.

For example, the logical group 802 may be configured to: compare a phase sequence number of a current bit channel with a period index of a puncturing pattern to obtain an electronic component 804 of a comparison result; recursively obtain an electronic component 806 of a transition probability of the bit channel according to the comparison result and bit parity conditions of a binary representation of a sequence number of the bit channel in each phase; obtain an electronic component 808 of the Bhattacharyya parameter and an error probability of each bit channel according to the transition probability; and determine an electronic component 810 of an information bit index set according to the Bhattacharyya parameters and/or the error probabilities.

In the method for constructing a punctured polar code provided in the present disclosure, a receiver performs decoding according to an information bit index set constructed by a punctured polar code in this embodiment of the present disclosure, which can improve decoding performance of the polar code.

In addition, the system 800 may include a memory 812, and the memory 812 stores instructions for performing functions related to the electronic components 804, 806, 808, and 810. Although it is illustrated that one or more of the electronic components 804, 806, 808, and 810 exist outside the memory 812, it may be understood that, one or more of the electronic components 804, 806, 808, and 810 may exist in the memory 812.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in the present application, it should be understood that the disclosed apparatus and method may be implemented in other manners. For example, the described device embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

In addition, functional units in the devices and systems in the embodiments of the present disclosure may be integrated into one processing unit, or each of the units may exist alone physically, or two or more units are integrated into one unit. The units may be implemented in a form of hardware, or may be implemented in a form of hardware in addition to a software functional unit.

All or some of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a USB flash drive, a removable hard disk, a read-only memory (Read Only Memory, ROM for short), a random access memory (Random Access Memory, RAM for short), a magnetic disk, or an optical disc.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. An apparatus for constructing a punctured polar code, comprising:
    a processor and a memory storage accessible to the processor, wherein the processor is configured to:
    compare a phase sequence number j of a current bit channel with a period index t of a puncturing pattern to obtain a comparison result, wherein the puncturing pattern is used to produce an input parameter of the polar code, and wherein $j=i \bmod 2^t$, the puncturing pattern is periodic, the period is $2^t$, and $i \in \{0, 1, \ldots, 2^t-1\}$;
    obtain a transition probability of the bit channel if the comparison result is that the phase sequence number j is less than or equal to the period index t and a bit of a binary representation of the phase sequence number of the bit channel in each phase corresponds to 0;
    obtain a reliability value of each bit channel according to the transition probability, wherein the reliability value comprises a Bhattacharyya parameter and an error probability; and
    select the smaller one of the error probability and the Bhattacharyya parameter of each bit channel, sort the selected smaller ones in ascending order, and select sequence numbers of bit channels corresponding to the first K smaller ones to form an information bit index set, wherein K is a positive integer less than or equal to a total quantity of the bit channels.

2. A method comprising:
    comparing a phase sequence number j of a current bit channel with a period index t of a puncturing pattern to obtain a comparison result, wherein the puncturing pattern is used to produce an input parameter of the polar code, and wherein $j=i \bmod 2^t$, the puncturing pattern is periodic, the period is $2^t$, and $i \in \{0, 1, \ldots, 2^t-1\}$;
    obtaining a transition probability of the bit channel if the comparison result is that the phase sequence number j is less than or equal to the period index t and a bit of a binary representation of the phase sequence number of the bit channel in each phase corresponds to 0;
    obtaining a reliability value of each bit channel according to the transition probability, wherein the reliability value comprises a Bhattacharyya parameter and an error probability; and select the smaller one of the error probability and the Bhattacharyya parameter of each bit channel, sort the selected smaller ones in ascending order, and select sequence numbers of bit channels corresponding to the first K smaller ones to form an information bit index set, wherein K is a positive integer less than or equal to a total quantity of the bit channels.

* * * * *